US012665584B1

(12) United States Patent　　　　(10) Patent No.:　US 12,665,584 B1
Wu　　　　　　　　　　　　　　　　(45) Date of Patent:　Jun. 23, 2026

(54) METASTABILITY-TOLERANT DROOP RESPONSE APPARATUS AND METHOD

(71) Applicant: Movellus Circuits Incorporated, Ann Arbor, MI (US)

(72) Inventor: Xiao Wu, Ann Arbor, MI (US)

(73) Assignee: Movellus Circuits Inc., Ann Arbor, MI (US)

( * ) Notice: Subject to any disclaimer, the term of this patent is extended or adjusted under 35 U.S.C. 154(b) by 54 days.

(21) Appl. No.: 18/655,204

(22) Filed: May 3, 2024

(51) Int. Cl.
*H03K 5/131* (2014.01)
*H03K 5/1252* (2006.01)
*H03L 7/091* (2006.01)
*H03L 7/099* (2006.01)

(52) U.S. Cl.
CPC ........... *H03K 5/131* (2013.01); *H03K 5/1252* (2013.01); *H03L 7/091* (2013.01); *H03L 7/0991* (2013.01)

(58) Field of Classification Search
CPC ...... H03K 5/131; H03K 5/1252; H03L 7/091; H03L 7/0991

USPC .......................................................... 375/376
See application file for complete search history.

(56) References Cited

U.S. PATENT DOCUMENTS

| | | | |
|---|---|---|---|
| 9,552,034 B2 | 1/2017 | Yeager | |
| 10,345,834 B2 | 7/2019 | Price et al. | |
| 2004/0119521 A1* | 6/2004 | Kurd ....................... | H03L 7/091 |
| | | | 327/291 |
| 2019/0064896 A1 | 2/2019 | Das | |
| 2023/0251699 A1 | 8/2023 | Acharya | |
| 2023/0314488 A1* | 10/2023 | Mosalikanti ............. | H03K 5/24 |
| | | | 327/113 |

* cited by examiner

*Primary Examiner* — Dominic D Saltarelli
(74) *Attorney, Agent, or Firm* — Lance Kreisman; Peninsula Patent Group

(57) ABSTRACT

An integrated circuit (IC) chip includes a voltage supply circuit to provide a supply voltage. A droop detection circuit couples to the voltage supply circuit to detect a reduction in the supply voltage and to generate a droop detection signal based on the reduction in the supply voltage. Asynchronous response circuitry couples to the droop detection circuit. The asynchronous response circuitry is responsive to the droop detection signal to generate a droop response signal to reduce a frequency of a clock signal from a nominal operating frequency to a reduced frequency.

17 Claims, 4 Drawing Sheets

FIG. 1

METASTABILITY-TOLERANT DROOP RESPONSE APPARATUS AND METHOD

TECHNICAL FIELD

The disclosure herein relates to digital systems, subsystems, integrated circuits, and associated methods.

BACKGROUND

Logic gates in a clock tree path of an integrated circuit (IC) chip, such as flip-flops, generally rely on a stable supply voltage in order to have a consistent setup timing margin. Changes in activity within a digital core of the IC chip often result in supply voltage fluctuations known as "droop." When droop events occur, the setup timing margin for the flip-flops narrows, potentially reaching a threshold where the flip-flops may experience timing errors. The reduced setup timing margin during the droop event may be widened by reducing a frequency of a clock signal applied to the flip-flops. When the droop event ends, the clock signal frequency may be restored to the original value.

Conventionally, droop response systems typically relied on a synchronizer-based architecture. While potentially beneficial for some applications, the synchronizer-based droop response architecture is typically prone to metastability and generally exhibits a relatively long adaptation period from when a droop event begins until the clock frequency is reduced.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 1 illustrates a clock tree path within an integrated circuit chip that includes an asynchronous metastability-tolerant response circuit.

DETAILED DESCRIPTION

Figure 2:
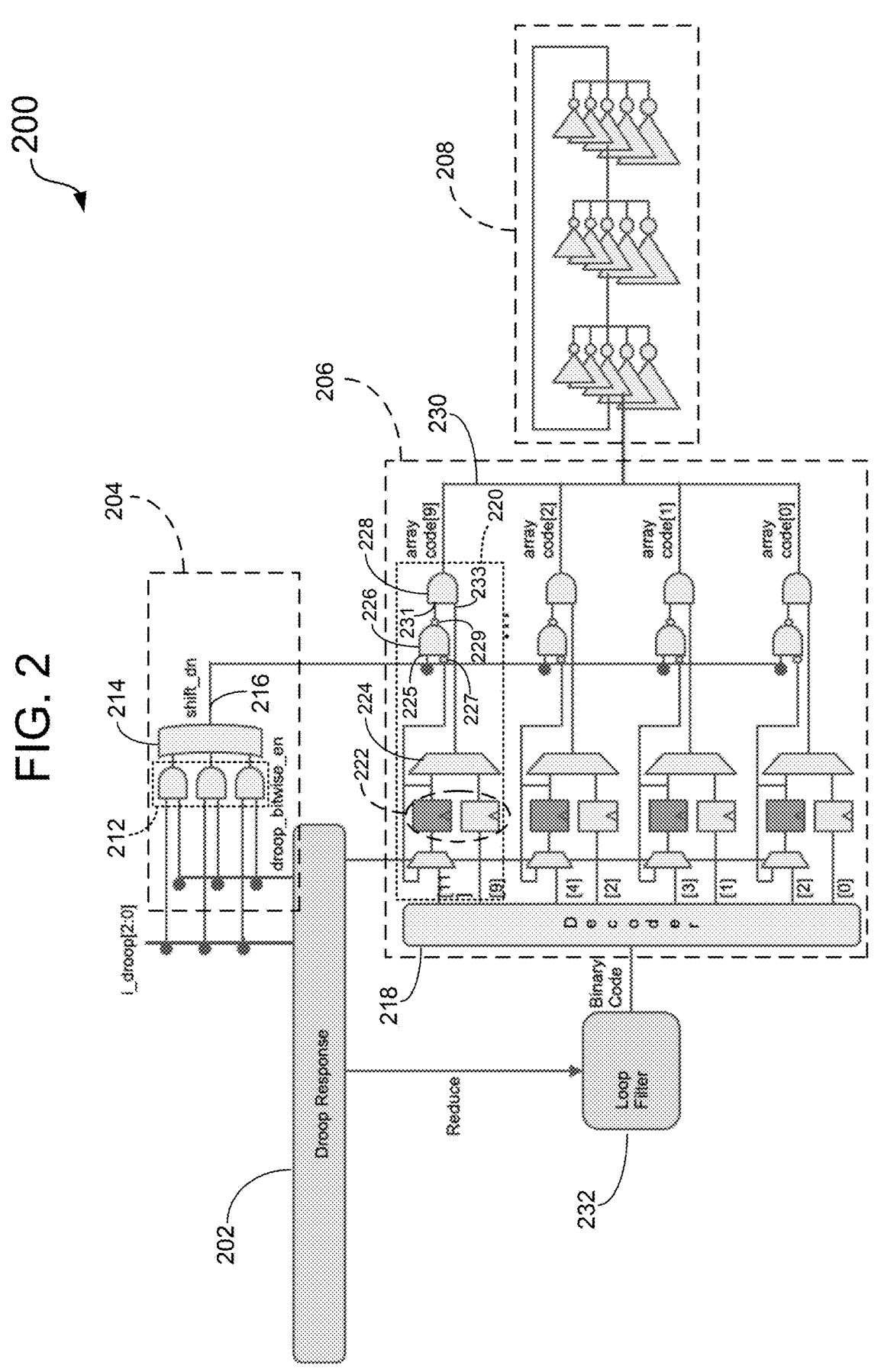
FIG. 2 illustrates further detail for one embodiment of the asynchronous metastability-tolerant response circuit of FIG. 1.

Digital systems, subsystems, integrated circuits, and associated methods are disclosed. In one embodiment, an integrated circuit (IC) chip is disclosed. The integrated circuit (IC) chip includes a voltage supply circuit to provide a supply voltage. A droop detection circuit couples to the voltage supply circuit to detect a reduction in the supply voltage and to generate a droop detection signal based on the reduction in the supply voltage. Asynchronous response circuitry couples to the droop detection circuit. The asynchronous response circuitry is responsive to the droop detection signal to generate a droop response signal to reduce a frequency of a clock signal from a nominal operating frequency to a reduced frequency. By using the asynchronous response circuitry to generate the droop response signal, the response time involved in detecting and responding to voltage supply droop may be significantly reduced while eliminating metastability in the droop response.

Figure 1:
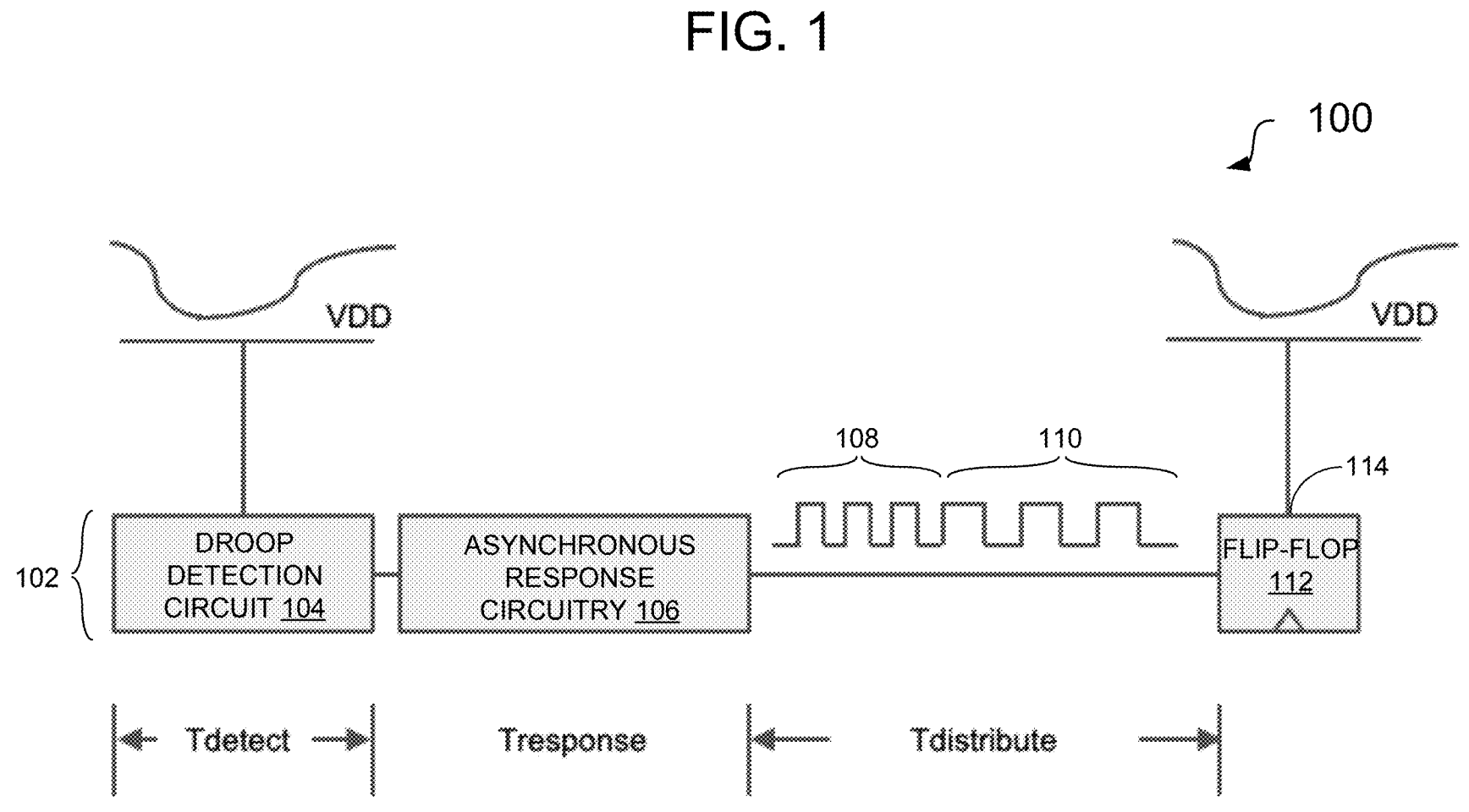

FIG. 1 illustrates one embodiment of a representative clock tree path 102 of a digital system 100, such as an integrated circuit (IC) chip. The clock tree path 102, one of possibly thousands of clock tree paths in the digital system 100, generally includes a droop detection circuit 104 that monitors a level of a supply voltage VDD, and generates a droop detection signal, within an adaptation time component $T_{detect}$, when a reduction in the supply voltage takes place. The supply voltage reduction may be caused by a variety of factors, such as digital core activity or other spurious noise. The duration of the droop event may last from one to several clock cycles. Asynchronous response circuitry 106 responds to the droop detection signal, within time component $T_{response}$, by generating a droop response signal to reduce a clock signal from a first nominal frequency, at 108, to a reduced frequency, at 110.

Further referring to FIG. 1, for one embodiment, the clock signal is generally distributed, within timing component $T_{distribute}$, to a logic gate 112, such as a flip-flop that terminates the clock tree path 102. Since the flip-flop 112 also receives the supply voltage, at 114, without the corresponding clock frequency reduction, the reduction in voltage may undesirably reduce the timing margin attributable to a successful setup time. Generally, the response time in reducing the clock frequency corresponds to the sum of the timing components $T_{detect}$, $T_{response}$, and $T_{distribute}$. Minimizing the response time corresponds to higher performance.

For one embodiment, the droop detection circuit 104 monitors the analog voltage level of the supply voltage VDD, and during a droop event, generates the droop detection signal as a multi-bit thermometer-coded digital signal. For one specific embodiment, shown in FIG. 2, the droop detection signal (shown as "i_droop [2:0]" in FIG. 2) is a thermometer-coded 3-bit value that represents four possible droop levels. As an example, a no-droop condition may be represented by a bit sequence of "000" in the droop detection signal, while a low-droop condition may correspond to a sequence of "001." For some embodiments, a moderate droop condition may correspond to a bit sequence of "011", while a large droop condition may be represented by "111." The droop detection code is fed to a droop response controller 202, and a shift-down circuit 204 that forms a portion of a bit shift selection circuit 206.

For one embodiment, the circuitry of FIG. 2 relies on a few general assumptions. For example, much of the circuitry of FIG. 2 may rely on control system activity provided by a closed-loop clock source such as a phase-locked loop (PLL). Additionally, an underlying assumption is that the control circuitry of the PLL includes a table of mappings (not shown) that identifies a minimum clock frequency that the system can operate at for each of the various droop severities noted above. Thus, when running at a lower frequency, the system may be more tolerant to a moderate level of droop, while at higher clock frequencies, the system may be less tolerant and sensitive to even a small level of droop.

Further referring to FIG. 2, for one embodiment, the asynchronous response circuitry 106 includes the droop response controller 202, the shift-down circuit 204, the bit shift selection circuit 206 and delay circuitry 208 employed in a digitally-controlled oscillator (DCO) circuit. The shift-down circuit 204 includes a set of AND gates 212 that receive the droop detection code at one input of each AND gate 212, and a droop bitwise enable signal droop_bitwise-en at a second input of each AND gate 212. The output of the AND gates 212 is fed to an OR gate 214 which generates a single-bit shift-down signal shift_dn, at 216. The shift-down signal shift_dn is fed to the bit shift selection circuitry 206 to carry out a fixed bit-shift.

With continued reference to FIG. 2, the bit shift selection circuitry 206 includes a decoder 218 that produces multiple thermometer-coded array codes. The codes are paired in a manner where each code of a pair is 2 bits apart from the other code. Each pair of codes is fed to a logic path, such as at 220, which includes a first stage of flip-flops 222 followed by a multiplexer 224. Interconnected logic gates 226 and 228 are disposed at the output of the multiplexer 224. A first one of the logic gates 226 incorporates a modified NAND function and includes a first input 225 that receives the shift-down signal, and a second inverted input 227 that receives the bit state for the higher code. An output, at 229, of the first gate 226 is true unless both inputs are true. The second gate 228 takes the form of an AND gate, and includes a first input 231 that receives the output of the first gate 226, and a second input 233 that receives the output from the multiplexer 224. The first gate 226 and the second gate 228 are configured to, in the presence of the shift-down signal shift_dn, pass the higher code from each of the pairs of codes to the delay circuitry 208. The resulting reduced array code corresponds to a reduced drive strength to the delay circuitry 208 and a correspondingly reduced output frequency from the DCO.

As one specific example, the pair of codes [9] and [11] fed along path 220 are two-bits apart. In the absence of droop, no shift-down signal is asserted by the shift-down circuit 204, so the signal for code [9], the "regular" array code, is able to pass through the selection path 220 to an array code bus, at 230. When the shift-down signal shift_dn is asserted, indicating a droop event, then both legs of the path 220 are evaluated, with the higher bit value code being passed to the array code bus 230. So, where code [9] may include the sequence "001111", and code [11] includes the sequence [000011], in response to the bit shift, code [11] is passed, which results in a two-bit shift of the code.

Figure 3:
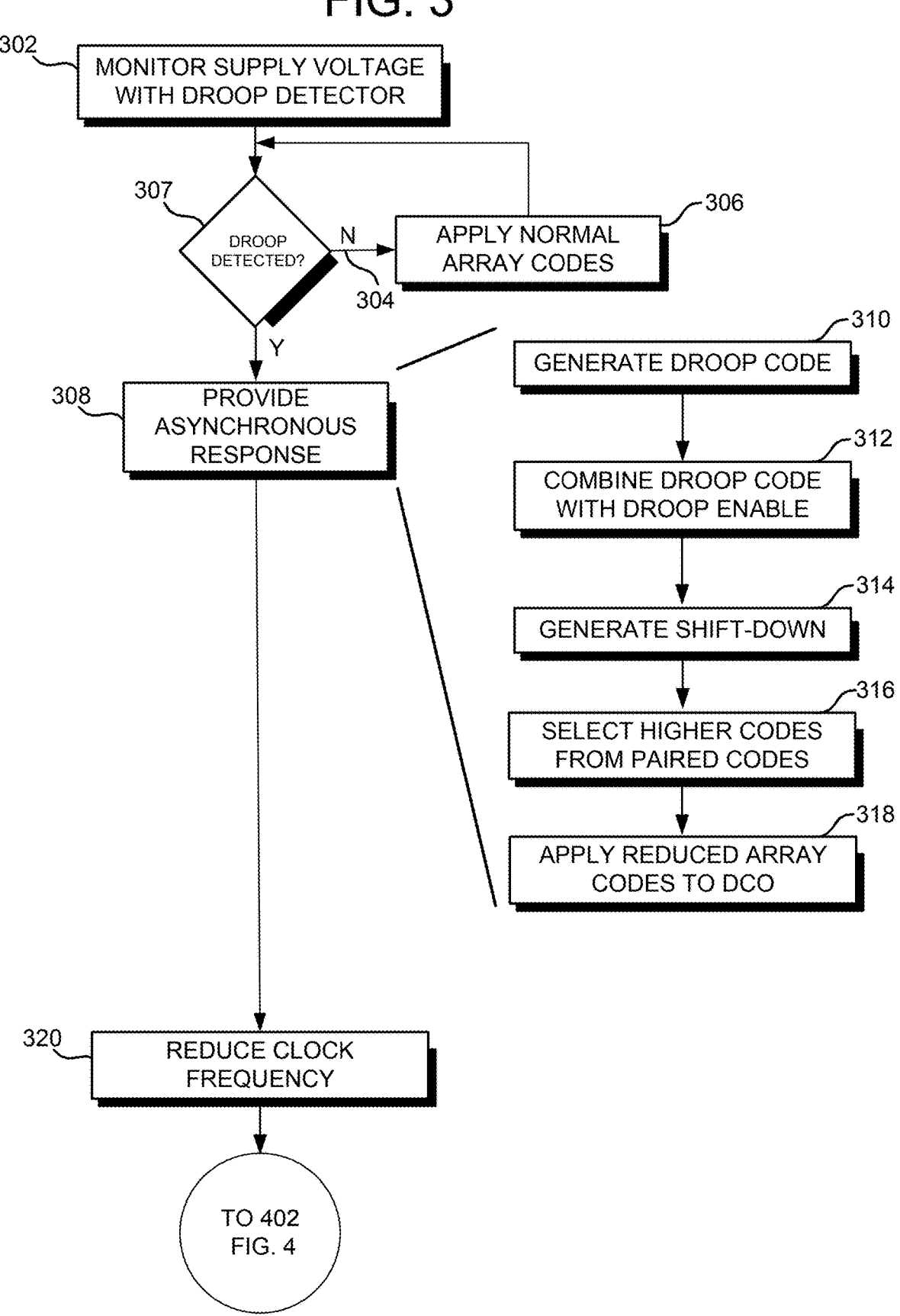
FIG. 3 illustrates a flowchart of steps corresponding to a method of operation of the asynchronous metastability-tolerant response circuit of FIG. 2.

In operation, the circuitry of FIG. 2 functions in a manner consistent with the steps shown in FIG. 3 to safely reduce the clock frequency associated with a clock tree path 102 (FIG. 1) during a droop event to maintain a sufficient timing margin for the flip-flop circuitry 112 (FIG. 1) disposed at the end of the clock tree path 102. Thus, while the integrated circuit (IC) chip is operating in a normal operating mode, with a nominal operating clock frequency, the droop detection circuit 104 continuously monitors the supply voltage level, at 302. When no droop events are detected, at 304, the nominal frequency code that is used during normal operation is consistently applied to the DCO, at 306. As a droop event begins to unfold, and evaluated at 307, the level of the droop eventually falls to a predetermined threshold value (such as a value indicating a low, moderate or high droop condition) that initiates the asynchronous metastability-tolerant droop response, at 308.

Further referring to FIG. 3, once the asynchronous metastability-tolerant droop response is initiated, at 308, a series of sub-steps are undertaken to minimize any effects from metastability acting on the droop response. At 310, with the droop detection code being generated, it is combined with the droop bitwise enable signals, at 312, to generate the shift-down signal shift_dn, at 314. With the shift-down signal shift_dn distributed to the various code pair paths, the higher code from each pair is selected, at 316. The reduced array code that results from the bit-shift step, at 316, is fed to the delay circuitry of the DCO, at 318, as a reduced drive strength signal, corresponding to a reduced current draw through the delay circuitry of the DCO, and a correspondingly lower clock frequency, at 320.

Reducing the clock frequency in this manner minimizes any adverse effects to the droop detection signal that may occur through metastability. This is due to the nature of the detection code/frequency reduction process being carried out in the current domain, rather than the synchronous digital domain. Additionally, without the need for synchronization in reducing the clock frequency, the response time from droop detection to clock frequency reduction is reduced to the combinational delay of the enable and shift-down logic circuitry shown in FIG. 2.

Figure 4:
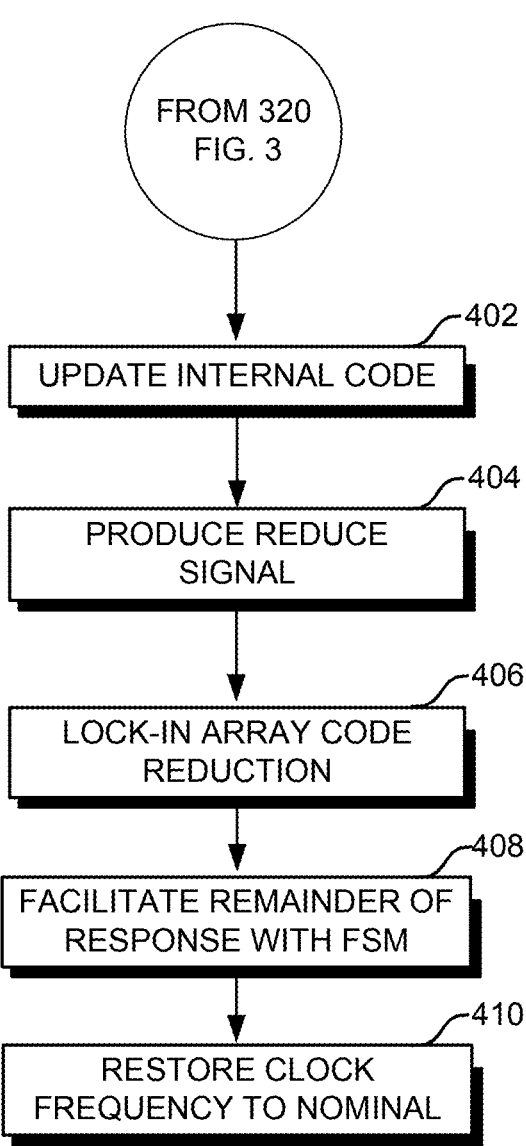
FIG. 4 illustrates a flowchart of further steps similar to the flowchart of FIG. 3.

Referring now to FIG. 4, after the droop detection signal reduces the frequency of the DCO through the combinational logic path, the synchronous control logic of the droop response controller 202 converges on the change in frequency code by internally updating its internally-generated frequency code to match the reduced code, at 402. This involves the droop response controller 202 producing a reduce signal for application to a loop filter 232 (FIG. 2), at 404. For one embodiment, the loop filter 232 is a proportional and integral loop filter that matches its internal integrated error and a resulting binary control code to the equivalent of the reduced array code. The droop response controller 202 then locks in the array code reduction, at 406, and facilitates the remainder of the droop response through use of a synchronous state machine, at 408.

Further referring to FIG. 4, after a certain time duration, the droop detection code will indicate an increase in the supply voltage that suggests a termination of the droop event. As the droop subsides, the clock frequency may be restored to the pre-droop level, at 410. One specific method for restoring the clock frequency to the pre-droop level in a ramped manner is described in copending U.S. patent application Ser. No. 18/655,206, filed May 3, 2024, titled: "RAMP-BASED DROOP RECOVERY APPARATUS AND METHOD", assigned to the assignee of the instant application and expressly incorporated by reference herein.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. An integrated circuit (IC) chip, comprising:
a system clock to generate a clock signal, the system clock comprising a digitally-controlled oscillator (DCO) circuit;
a voltage supply circuit to provide a supply voltage;
a droop detection circuit coupled to the voltage supply circuit to detect a reduction in the supply voltage and to generate a droop detection signal based on the reduction in the supply voltage;
asynchronous response circuitry coupled to the droop detection circuit, the asynchronous response circuitry being asynchronous to the clock signal and responsive to the droop detection signal to generate a droop response signal to reduce a frequency of the clock signal from a nominal operating frequency to a reduced frequency; and
wherein the DCO is responsive to application of a first digital code to generate the nominal operating frequency and responsive to application of a reduced digital code corresponding to the droop response signal to generate the reduced frequency.

2. The IC chip of claim 1, wherein:
the asynchronous response circuitry includes circuitry to generate the reduced digital code.

3. The IC chip of claim 2, wherein:
the circuitry to generate the reduced digital code includes bit shift selection circuitry to generate the reduced digital code in response to receiving a shift signal based on the droop detection signal.

4. The IC chip of claim 2, wherein:
the first digital code and the reduced digital code are thermometer-encoded.

5. The IC chip of claim 1, further comprising:
a droop response controller to receive a copy of the droop detection signal and to generate a reduce signal; and
a loop filter coupled to the droop response controller and responsive to the reduce signal to internally configure a resulting binary code to correspond to the reduced digital code.

6. The IC chip of claim 1, wherein:
the DCO includes a delay circuit responsive to the reduced digital code to reduce a current draw parameter, and wherein the frequency of the clock signal is based on the current draw parameter.

7. A voltage droop response circuit, comprising:
a droop detection circuit for coupling to a voltage supply circuit that generates a supply voltage, the droop detection circuit to detect a reduction in the supply voltage and to generate a droop detection signal based on the reduction in the supply voltage; and
asynchronous response circuitry coupled to the droop detection circuit, the asynchronous response circuitry being asynchronous to a clock signal of a system clock and responsive to the droop detection signal to generate a droop response signal to reduce a frequency of the clock signal from a nominal operating frequency to a reduced frequency; and
wherein the system clock comprises a digitally-controlled oscillator (DCO) circuit to generate the clock signal, the DCO being responsive of a first digital code to generate the nominal operating frequency, and responsive to application of a reduced digital code corresponding to the droop response signal to generate the reduced frequency.

8. The voltage droop response circuit of claim 7, wherein:
the asynchronous response circuitry comprises circuitry to generate the reduced digital code.

9. The voltage droop response circuit of claim 8, wherein:
the circuitry to generate the reduced digital code comprises bit shift selection circuitry to generate the reduced digital code in response to receiving a shift signal based on the droop detection signal.

10. The voltage droop response circuit of claim 8, wherein:
the first digital code and the reduced digital code are thermometer-encoded.

11. The voltage droop response circuit of claim 7, further comprising:
a droop response controller to receive a copy of the droop detection signal and to generate a reduce signal; and a loop filter coupled to the droop response controller and responsive to the reduce signal to internally configure a resulting binary code to correspond to the reduced digital code.

12. The voltage droop response circuit of claim 7, wherein:

the DCO includes a delay circuit responsive to the reduced digital code to reduce a current draw parameter, and wherein the frequency of the clock signal is based on the current draw parameter.

13. A method of operation in an integrated circuit (IC) chip, the method comprising:

providing a supply voltage with a voltage supply circuit;

generating a clock signal with a system clock that comprises a digitally-controlled oscillator (DCO) circuit, responding to application of a first digital code with the DCO to generate a nominal operating frequency, detecting a reduction in the supply voltage with a droop detection circuit and generating a droop detection signal based on the reduction in the supply voltage;

asynchronously responding to the droop detection signal with an asynchronous response circuit that is asynchronous to the clock signal of the system clock, the asynchronously responding including generating a droop response signal to reduce a frequency of the clock signal from the nominal operating frequency to a reduced frequency; and responding to application of a reduced digital code corresponding to the droop response signal to generate the reduced frequency.

14. The method of claim 13, further comprising:

generating the reduced digital code with bit shift selection circuitry in response to receiving a shift signal based on the droop detection signal.

15. The method of claim 13, further comprising:

thermometer-encoding the first digital code and the reduced digital code.

16. The method of claim 13, further comprising:

receiving a copy of the droop detection signal with a droop response controller;

generating a reduce signal with the droop response controller; and internally configuring a resulting binary code with a loop filter to correspond to the reduced digital code.

17. The method of claim 13, wherein:

reducing a current draw parameter in response to the reduced digital code with a delay circuit; and wherein the frequency of the clock signal is based on the current draw parameter.

\* \* \* \* \*